(12) United States Patent
Yoshii

(10) Patent No.: US 6,359,458 B1
(45) Date of Patent: Mar. 19, 2002

(54) APPARATUS FOR DETECTING A DIAPHRAGM FAILURE

(76) Inventor: Yoshiharu Yoshii, 9-14, Yakata 2-chome, Izumi-ku, Sendai-shi, Miyagi 981-3214 (JP)

( * ) Notice: Subject to any disclaimer, the term of this patent is extended or adjusted under 35 U.S.C. 154(b) by 0 days.

(21) Appl. No.: 09/103,882

(22) Filed: Jun. 24, 1998

(30) Foreign Application Priority Data

Jul. 18, 1997 (JP) ............................................. 9-210095

(51) Int. Cl.[7] .............................................. G01R 31/26
(52) U.S. Cl. ...................................................... 324/765
(58) Field of Search ................................. 324/537, 765, 324/754; 257/758; 73/728

(56) References Cited

U.S. PATENT DOCUMENTS

| | | | | |
|---|---|---|---|---|
| 5,473,253 A | * | 12/1995 | Araki | ........................ 324/537 |
| 5,670,891 A | * | 9/1997 | Ling et al. | ................... 324/765 |
| 5,793,297 A | * | 8/1998 | Takeuchi et al. | ............ 340/635 |
| 5,903,164 A | * | 5/1999 | Kline | ........................ 324/765 |
| 5,914,635 A | * | 6/1999 | Yamamoto | ................... 327/561 |

* cited by examiner

Primary Examiner—Safet Metjahic
Assistant Examiner—J Kerveros

(57) ABSTRACT

It is an object of the present invention to provide a new apparatus for detecting a diaphragm failure. The apparatus according to the present invention has a line-shaped resistor (r) formed on a diaphragm (23), one end of the line-shaped resistor (r) connected to a failure detection terminal (S1, S2). When any failure is found in the diaphragm (23), the resistance value of the entire line-shaped resistor is different than when the diaphragm is normal. A failure of the diaphragm can be detected by using the failure detection terminal (S1, S2) to measure the resistance value of the line-shaped resistor and comparing the result with a normal value.

11 Claims, 5 Drawing Sheets

50

APPARATUS FOR DETECTING A DIAPHRAGM FAILURE

FIELD OF THE INVENTION

The present invention relates, in general, to an apparatus for detecting a diaphragm failure, and, more specifically, to an apparatus for detecting a failure of a semiconductor diaphragm.

BACKGROUND OF THE INVENTION

With recent advances in micro-machining technology, semiconductor diaphragms are finding their way into various applications. For example, semiconductor diaphragms are used in semiconductor pressure sensors, flow sensors, acceleration sensors, micro-machining relays, and actuators that control inflow and outflow of fluids, and so forth. Although an apparatus of this type that uses a semiconductor diaphragm may be utilized in a variety of industrial applications, its potential benefit in the field of medical equipment is also anticipated, because a kind of very small pump structure may be fabricated in a miniature area measuring only several millimeters square.

FIG. 1A is a cross-sectional view of a prior art piezoresistive-type pressure sensor (10) that uses a semiconductor diaphragm. FIG. 1B is a plan view of the pressure sensor (10), where a cross section along A—A is represented by FIG. 1A. The pressure sensor (10) is comprised of a diaphragm (13), an N-type semiconductor substrate (11) that supports the diaphragm, and a piezoresistive element (12) formed of a P- diffusion layer disposed on the diaphragm (13), wherein for the piezoresistive element, a predetermined electrical wiring pattern is made to a power supply and a pressure sense terminal (not shown).

The pressure sensor (10) operates as follows. First, when no external pressure is applied, no stress acts upon the piezoresistive elements (12-1) through (12-4), so that an electrical signal derived from the pressure sense terminal indicates that no pressure is applied. Next, when an external pressure is applied, the diaphragm (13) deflects in the direction of arrow (14). This deflection causes the piezoresistive elements (12-1) through (12-4) to be stressed in the direction of arrow (15) or (16). Different directions of stress acting upon each piezoresistive element are attributable to the locations of the piezoresistive elements. That is, the piezoresistive elements (12-1) and (12-3) are disposed normal to the peripheral portion of the diaphragm, whereas the piezoresistive elements (12-2) and (12-4) are located in parallel. It should be appreciated that each piezoresistive element is located around the diaphragm because the stress, which is developed around the diaphragm when it is deflected, is greater than that developed in other portions. Depending upon the stress acting in the direction of arrow (15) or (16), the resistance of the piezoresistive elements (12-1) and (12-3) increases or decreases, while the resistance of the piezoresistive elements (12-2) and (12-4) decreases or increases. As a result, the pressure can be sensed by detecting the potential difference developed on the pressure sense terminal.

With such a prior art diaphragm-based apparatus, there is no mechanism for detecting any failure, when failures, such as fracture, cracking, deformation, and damage, are developed in the diaphragm. The present invention has its objective to provide an apparatus that can facilitate simple detection of diaphragm failures.

Furthermore, when a semiconductor diaphragm-based apparatus is fabricated, any failure that occurs during the wafer fabrication process cannot be detected at a wafer level (or wafer process). Failures cannot be detected until the assembly of the entire apparatus is completed after the wafer fabrication process. With a semiconductor pressure sensor, for example, it is determined whether the diaphragm is acceptable or not, only after the pressure sensor is assembled and tests are conducted for its output characteristics by applying external pressure thereto. Accordingly, it is an objective of the present invention to provide an apparatus that can facilitate simple detection of diaphragm failures at a wafer level.

Diaphragm failures may occur not only during the fabrication process, but also while it is used by the user. During its use by the user, it is generally difficult to determine whether any failure has occurred in the diaphragm. For example, it is hard to determine whether the output data derived from the semiconductor pressure sensor is normal as external pressure is applied thereto or it reflects any diaphragm failure. Accordingly, the present invention has its aim to provide an apparatus that can facilitate simple detection of diaphragm failures even during its use by the user.

Furthermore, a small damage on the diaphragm, at first, may gradually grow later. Accordingly, it is another objective of the present invention to provide an apparatus that permits early detection of diaphragm failures.

SUMMARY OF THE INVENTION

The above objectives are achieved by an apparatus for detecting a diaphragm failure, comprising: a diaphragm; a substrate for supporting the diaphragm; and a line-shaped resistor disposed in at least one side of the diaphragm. One end of the line-shaped resistor is coupled to a failure detection terminal. In one embodiment, the line-shaped resistor is formed around and at a center of the diaphragm, and the line-shaped resistor is comprised of multiple line elements, so that distances from one line element to its adjacent line elements are substantially equal. Also, layout patterns of at least two line elements are similar in figure to each other.

The failure detection apparatus according to the present invention has a line-shaped resistor formed on a diaphragm, with one end of the line-shaped resistor coupled to a failure detection terminal. When any diaphragm failure occurs, the resistance value of the overall line-shaped resistor differs from that under a normal condition. The failure detection terminal is used to measure the resistance value of the line-shaped resistor, which is compared against a normal value, thereby allowing for detection of a diaphragm failure.

DETAILED DESCRIPTION OF THE INVENTION (1) First Embodiment

Figure 1A:
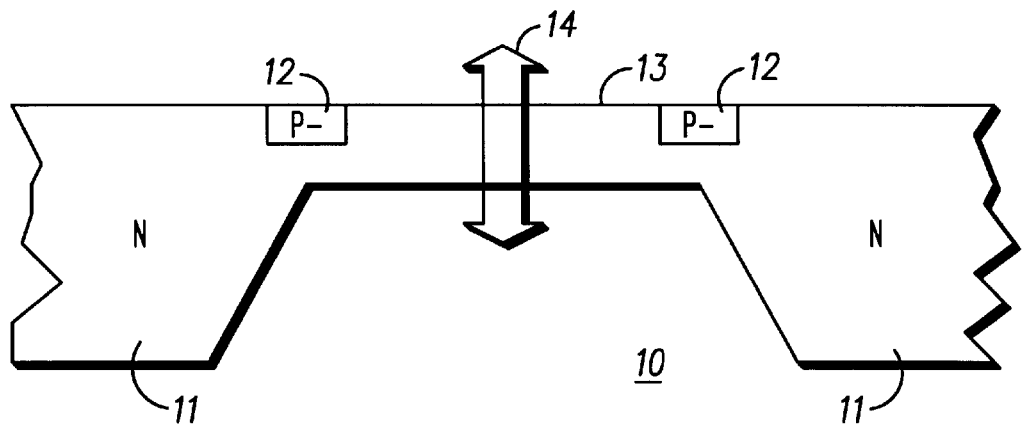
FIG. 1A shows a cross-sectional view of a prior art pressure sensor that employs a semiconductor diaphragm.
Figure 1B:
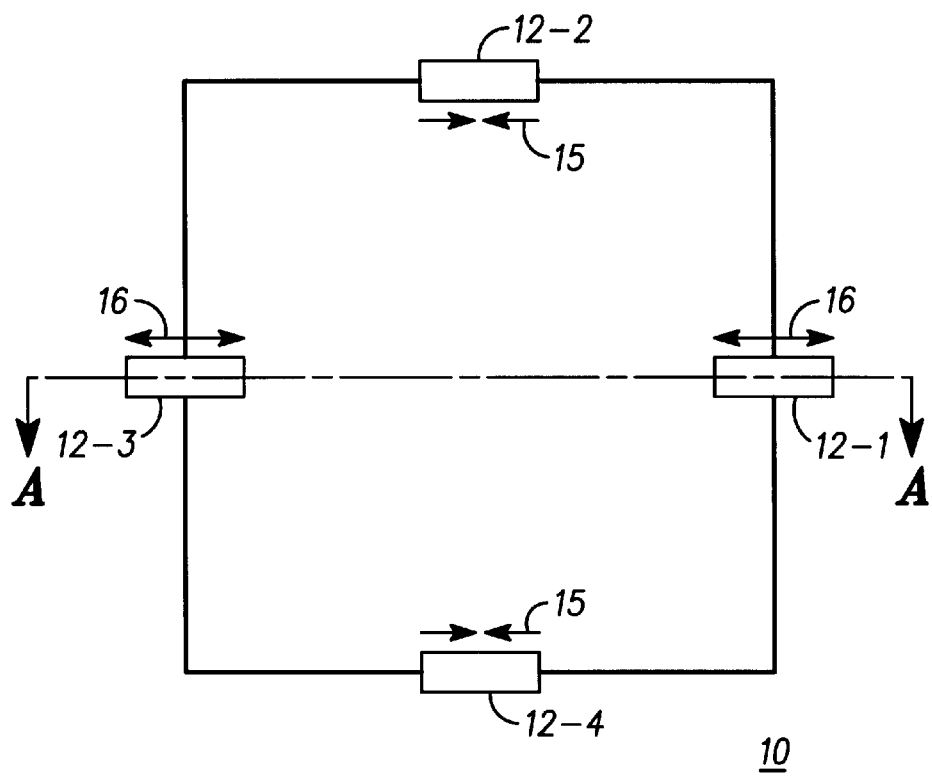
FIG. 1B shows a top plan view of a prior art pressure sensor that employs a semiconductor diaphragm.
Figure 2A:
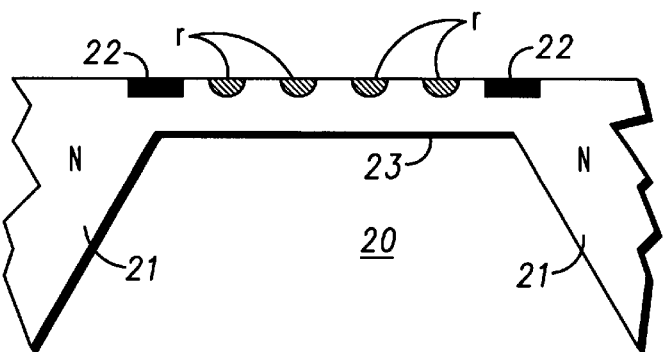
FIG. 2A shows a cross-sectional view of a piezoresistive pressure sensor according to one embodiment of the present invention.
Figure 2B:
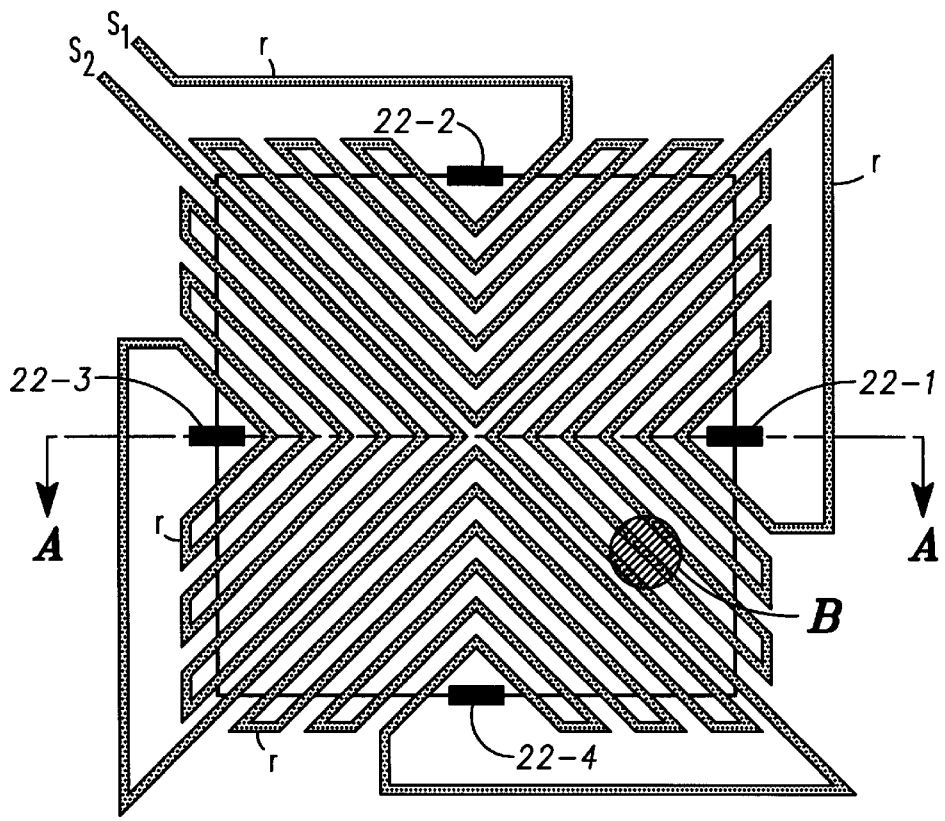
FIG. 2B shows a top plan view of a piezoresistive pressure sensor according to one embodiment of the present invention.

FIG. 2A shows a semiconductor pressure sensor (20) according to a first embodiment of the present invention. FIG. 2B shows a plan view of the pressure sensor (20), where a cross section along A—A is represented by FIG. 2A. Similar to the prior art pressure sensor shown in FIG. 1, the pressure sensor (20) is comprised of a diaphragm (23), an N-type semiconductor substrate (21) that supports the diaphragm, and a piezoresistive element (22) formed of a P-diffusion layer disposed on the diaphragm (23), wherein for the piezoresistive element, a predetermined electrical wiring pattern is made to a power supply and a pressure sense terminal (not shown).

Figure 2C:
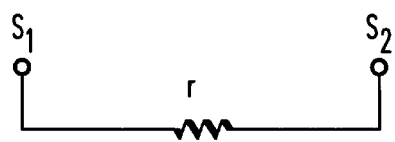
FIG. 2C shows an equivalent circuit of FIG. 2B.

Unlike the prior art pressure sensor (10), in the present embodiment, the line-shaped resistor (r) is disposed on the diaphragm (23) as shown in FIGS. 2A and 2B. The line-shaped resistor (r) is disposed by forming the piezoresistive element (22) and forming a P+ diffusion layer through ion implantation as an electrical wiring pattern for the piezoresistive element (22) is made. Because the process for forming the line-shaped resistor (r) is similar to the process for forming a wiring pattern of the piezoresistive element to the power supply arid pressure sense terminal, it is desirable to form the line-shaped resistor (r) at the stage of wiring the piezoresistive element, but it is not restricted thereto. The dopant concentration of the P+ diffusion layer is preferably 1E+19 to 1E+20 atoms/cm$^3$, but other values may be used depending on applications. That is because, as described later, the resistance value of the line-shaped resistor may be small enough to permit detection of any change in resistance due to the deformation of the diaphragm. Incidentally, the dopant concentration of the piezoresistive element used for this type of pressure sensor is generally 1E+15 to 1E+17 atoms/cm$^3$. One end of the line-shaped resistor (r) is coupled to a failure detection terminal S1, while the other end is coupled to a failure detection terminal S2. On the diaphragm (23), areas other than the area where the piezoresistive element (22) is disposed are substantially covered entirely by the line-shaped resistor (r). The relationship between the line-shaped resistor (r) and failure detection terminals S1 and S2 is represented by an equivalent circuit of FIG. 2C.

Next, a method for detecting a diaphragm failure according to the present embodiment is described. Detection of a diaphragm failure, such as fracture, cracking, is detected by applying a voltage or current to the failure detection terminals S1 and S2 and measuring a resistance value of the line-shaped resistor (r). For example, when fracture occurs in area B (FIG. 2B) of the diaphragm, the fracture causes the overall resistance value of the line-shaped resistor (r) to differ from the resistance value without any fracture. Especially, if the line-shaped resistor (r) in area B is broken due to the fracture of the diaphragm, the overall resistance value of the line-shaped resistor (r) becomes extremely high. By detecting the resulting change in the resistance value, a diaphragm failure can be detected.

In the present embodiment, a failure developed during the wafer fabrication process may also be detected at a wafer level (or at wafer process). In the present embodiment, a failure due to the deformation of the diaphragm may also be detected, because the resistance value of the line-shaped resistor (r) changes as the diaphragm is deformed. According to the present embodiment, occurrence of a failure in the diaphragm, such as fracture, cracking, deformation, and damage, can be detected.

Meanwhile, if area B where a diaphragm failure has occurred is located away from the line-shaped resistor, the failure may not be detected, because that diaphragm failure does not. cause the resistance value of the line-shaped resistor to change. Thus, in order to detect a failure in any location on the diaphragm, it is necessary to dispose the line-shaped resistor (r) over the entire diaphragm. If the resistor (r) is not line-shaped but planar, such as a resistor layer, a diaphragm failure cannot be detected acceptably. This is because changes in the resistance value due to a diaphragm failure is smaller as compared to its line-shaped counterpart, thereby making it difficult to detect changes in the resistance value. Therefore, in order to acceptably detect a failure in any location of the diaphragm, it is desirable that the line-shaped resistor be disposed so as to substantially cover the entire area, except the area where the piezoresistive elements, etc. are located, and that the line-shaped resistor be a thin, long resistor. However, as the resistor becomes thinner, its resistance value per unit length generally increases, so it is more difficult to detect a change in the resistance value of the line-shaped resistor (r). Accordingly, in order to reduce the resistance value of the line-shaped resistor (r) under normal condition, it is necessary to increase the dopant concentration of the line-shaped resistor sufficiently, for example.

(2) Second Embodiment

Figure 3A:
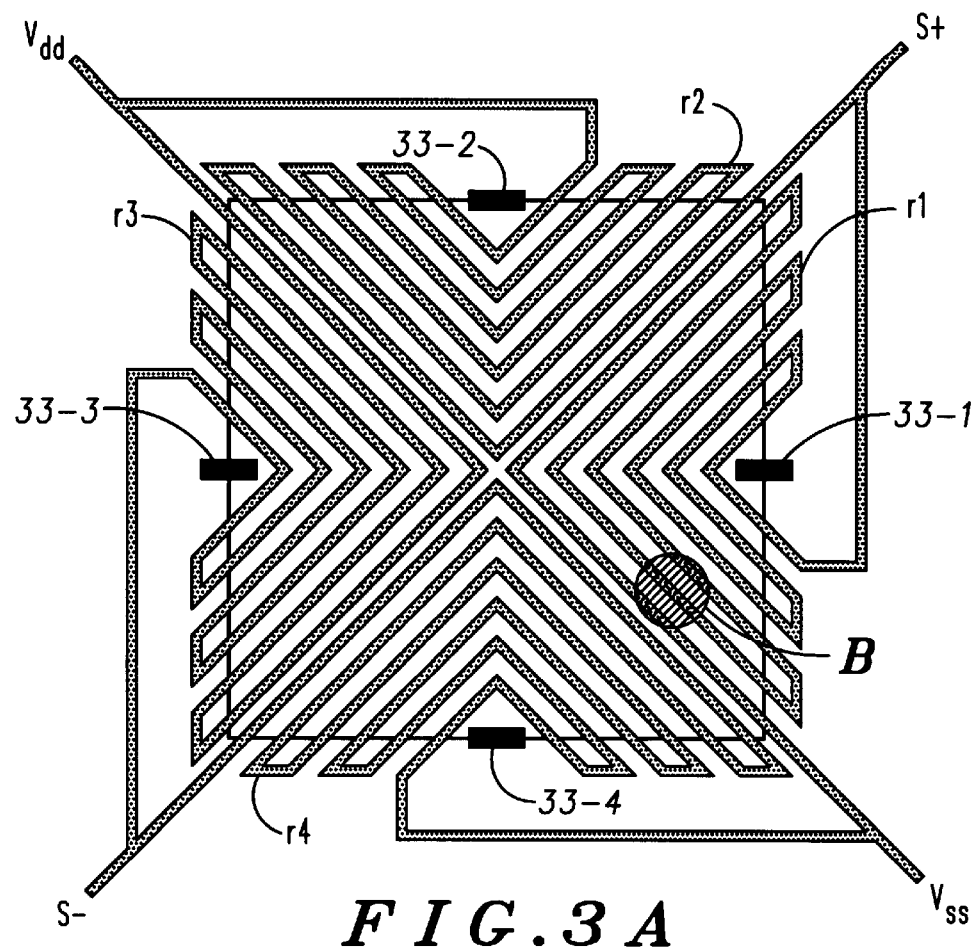
FIG. 3A shows a top plan view of a piezoresistive-type pressure sensor according to another embodiment of the present invention.
Figure 3B:
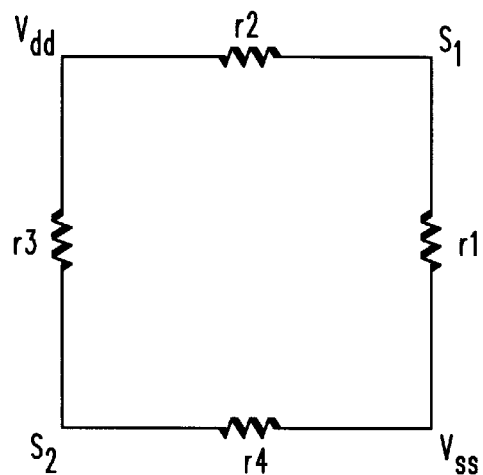
FIG. 3B shows an equivalent circuit of FIG. 3A.

The wiring pattern of the failure detection terminals relative to the line-shaped resistor (r) according to the present invention is not restricted to that shown in FIG. 2B. FIG. 3A shows an embodiment where another wiring pattern is employed. FIG. 3A shows a plan view of a pressure sensor, and FIG. 3B shows a partial equivalent circuit of a failure detection circuit. The elements and structures, except for the line-shaped resistor, are similar to those shown in FIGS. 2A–2C.

In the present embodiment, four line-shaped resistors (r1)–(r4) are disposed on the diaphragm. One end of each line-shaped resistor is coupled to a failure detection terminal S1 or S2, while the other end is coupled to a high-potential power supply Vdd or low-potential power supply Vss, so that a bridge circuit is formed as a whole, as shown in FIG. 3B. The four line-shaped resistors (r1)–(r4) have the same length and resistance value.

Next, a method for detecting a diaphragm failure according to the present embodiment is described. It is similar to FIGS. 2A–2C in that a change in the resistance value of the line-shaped resistor caused by a diaphragm failure is utilized. First, when the diaphragm is normal, the four line-shaped resistors (r1)–(r4) all have substantially the same resistance value, so no voltage potential difference is developed between the failure detection terminals S1 and S2. However, when a diaphragm failure occurs, for example, when fracture occurs in area B, the resistance value of the line-shaped resistor (r1) changes, producing a voltage potential difference between the failure detection terminals S1 and S2, so that the diaphragm failure can be detected. In the present embodiment, because each line-shaped resistor covers a quarter area of the diaphragm, it can be determined, by identifying which line-shaped resistor produces a change in its resistance value, which area a diaphragm failure has occurred in, thereby facilitating failure analysis for a pressure sensor or its fabrication process.

Next, the relationship between pressure detection for the pressure sensor and failure detection for the diaphragm is described. In the present embodiment, four piezoresistive elements (33-1) through (33-4) are disposed at four peripheral portions of the diaphragm, but they are not all placed in the same positional relationship. In this respect, it is similar to the prior art pressure sensor (10) and the pressure sensor (20) according to the first embodiment. On the other hand, each line-shaped resistor (r1)–(r4) is disposed so as to evenly cover a quarter area of the diaphragm and is located in the same positional relationship relative to the periphery of the diaphragm. Thus, if the diaphragm is deformed by application of external pressure to the pressure sensor, the line-shaped resistors (r1)–(r4) all exhibit equivalent changes in their resistance value. As a result, if any failure has occurred in the diaphragm, a voltage potential difference is developed between the failure detection terminals S1 and S2, but if there is no failure, no potential difference appears therebetween. For the piezoresistive elements (33-1) through (33-4), on the other hand, a potential difference due to a change in the piezoresistance is detected for the same reason as described in connection with FIG. 1, so that pressure is detected. Thus, according to the present embodiment, pressure detection and detection of a diaphragm failure are performed independently of each other. That is, the normal deformation of the diaphragm due to external pressure can be definitely distinguished from a diaphragm failure, so that the diaphragm failure can be detected even while the pressure sensor is being used.

(3) Another Embodiment

In the above embodiment, the line-shaped resistor is disposed on one side of the diaphragm, but it may be disposed on both sides of the diaphragm. In this case, a failure on either side of the diaphragm can be detected. Thus, even if a minute fracture developed on one side of the diaphragm gradually grows to the extent that it reaches the other side, it can be detected at a stage where such minute fracture has occurred, thereby allowing for early detection of a diaphragm failure.

Figure 4:
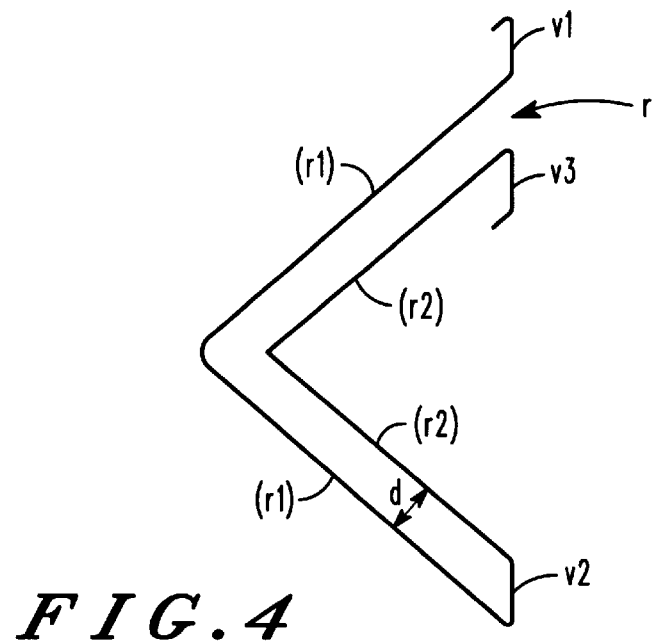
FIG. 4 is a partial enlarged plan view of a line-shaped resistor according to an embodiment of the present invention.

Also in the above embodiment, the line-shaped resistor is arranged in a layout pattern such that it is comprised of multiple bending line elements (r1, r2, . . . ) and multiple turns (v1, v2, . . . ), with a distance "d" between one line element (r1) and its adjacent line element (r2) substantially constant, but other patterns may also be employed. For example, line elements may be comprised of simple straight lines or curves, rather than bending line elements. Additionally, one line element may be comprised of a zigzag line. A more complex pattern of line elements would permit detection of a diaphragm failure with greater accuracy, as compared to the arrangement of a simple straight line. For examples with the pattern shown in FIG. 4, if a small fracture occurs between line elements (r1) and (r2) and therealong, it is difficult to detect a diaphragm failure. However, with a more complex pattern of lines that comprise line elements, such a diaphragm failure can also be detected. In short, in order to acceptably detect a failure in any location of the diaphragm, no matter what pattern is used, a line-shaped resistor may be disposed so as to substantially cover the entire diaphragm, so that a change in the resistance value of the line-shaped resistor may be generated when a failure, such as fracture, occurs in the diaphragm.

(4) Further Embodiments

So far, it has been described that the present invention is applied to a piezoresistance-type pressure sensor, but the present invention is not limited thereto. It may be applicable to a capacitance-type pressure sensor, a semiconductor diaphragm-based flow sensor, an acceleration sensor, a micro-machining relay, an actuator that controls inflow and outflow of a fluid and etc.

Figure 5:
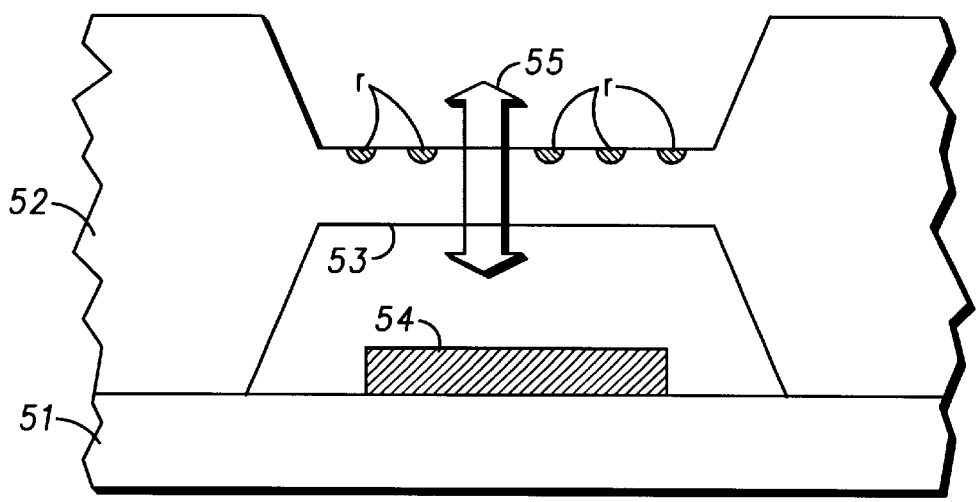
FIG. 5 shows a cross-sectional view of a capacitor-type pressure sensor that employs the present invention.

FIG. 5 shows a case where the present invention is applied to a capacitance-type pressure sensor (50). Line-shaped resistors (r) are disposed on a diaphragm (53). When external pressure is applied, the diaphragm (53) deflects in the direction of arrow (55), and the capacitance of capacitors (53, 54) changes, thereby allowing for pressure detection.

Figure 6:
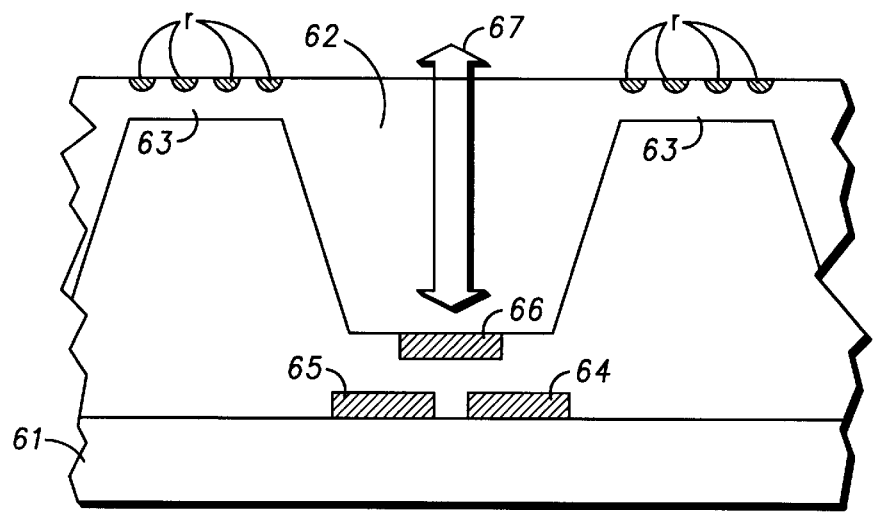
FIG. 6 shows a cross-sectional view of micro-machining relay using the present invention.

FIG. 6 shows a case where the present invention is applied to a micro-machining relay. Line-shaped resistors (r) are disposed on both diaphragms (63). By moving the mass (62) in the direction of arrow (67) by use of static electricity force, etc., electrodes (64) and (65) become electrically conductive or nonconductive.

Figure 7:
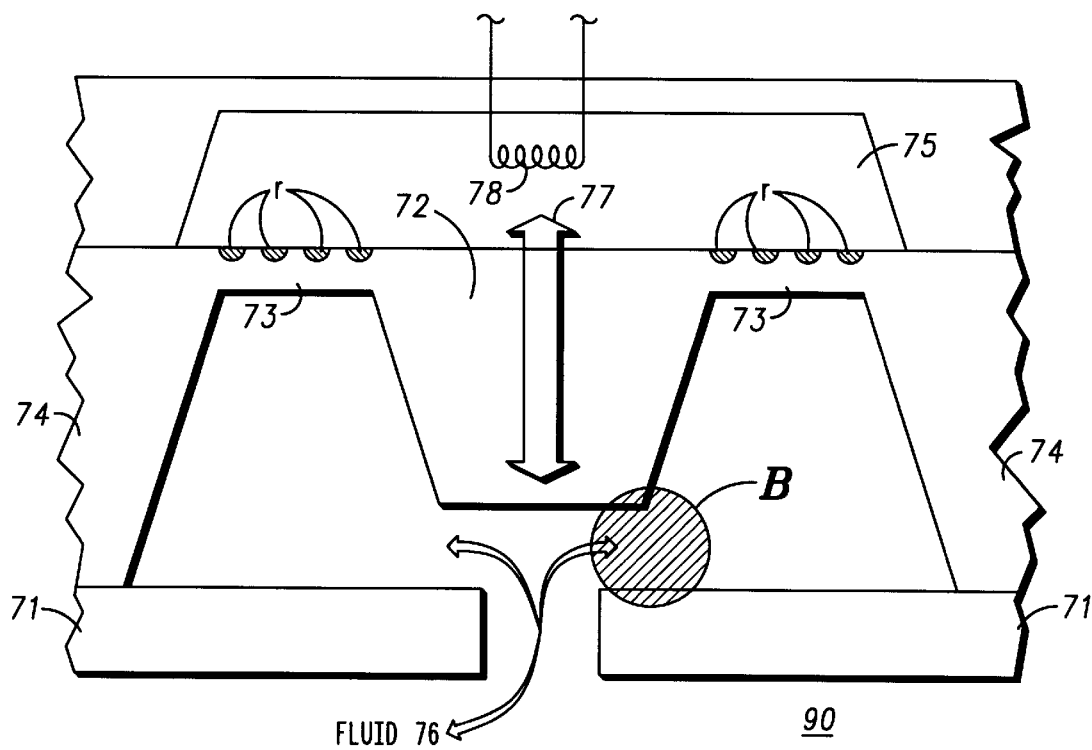
FIG. 7 shows a cross-sectional view of an actuator for controlling fluid input and output that employs the present invention.

FIG. 7 shows a case where the present invention is applied to an actuator that controls inflow and outflow of a fluid. Line-shaped resistors (r) are disposed on diaphragms (73). As the fluid (75) expands and contracts due to a heater (78) to move the mass (72) in the direction of arrow (77), an inner area (80) and an outer area (90) are separated from each other or coupled together. This controls inflow and outflow of the fluid (76) between the inner and outer areas (80) and (90).

In the cases of FIGS. 5–7, the resistance value of the line-shaped resistor changes upon occurrence of a diaphragm failure, thereby permitting detection of that failure. In these embodiments, it is not necessary to dispose any piezoresistive element on the diaphragm, so that restrictions associated with the layout pattern for the line-shape)ed resistor (r) (e.g., arrangement of line-shaped resistors in areas excluding the piezoresistive element area) are mitigated.

Furthermore, the presence of any foreign matter admitted between the mass (72) and outer wall substrate (71) in FIG. 7 can be detected. More specifically, if no foreign matter is admitted, the right and left diaphragms are deformed similarly as the mass (72) is brought into close contact with the outer wall substrate (71), so the resistance of the line-shaped resistor produced by that deformation also change similarly. However, if any foreign matter is admitted in area B between the mass (72) and outer wall substrate (71), the foreign matter admitted prevents the mass (72) from being brought into close contact with the outer wall substrate (71). As the mass (72) is brought into close contact, the degree of deformation produced in the right and left diaphragms (73) differs, so that the resulting resistance value of the line-shaped resistor differs. Thus, by checking whether the resistance values of the line-shaped resistors on the right and left diaphragms are the same or not, the admittance of any foreign matter can be detected.

What is claimed is:

1. An apparatus for detecting a diaphragm failure, comprising:
    a diaphragm;
    a substrate for supporting the diaphragm; and
    a line-shaped resistor formed of one material type disposed on at least one side of the diaphragm and having first and second ends coupled for sensing a resistance of the one material type to determine the diaphragm failure.

2. An apparatus according to claim 1, wherein a plurality of line-shaped resistors are disposed in a plurality of regions on the portion of the first major surface overlying the diaphragm.

3. An apparatus according to claim 1, wherein the portion of the first major surface overlying the diaphragm is substantially covered entirely by the at least one line-shaped resistor.

4. An apparatus according to claim 1, wherein the multiple line elements are distributed symmetrically on the first major surface.

5. An apparatus according to claim 1, wherein the diaphragm and the substrate are formed of silicon of a first conductivity type, and the line shaped resistor is formed of a diffusion layer of a second conductivity type.

6. An apparatus according to claim 5, wherein a dopant concentration of the diffusion layer comprising the line-shaped resistor is 1E+19 to 1E+20 atoms/cm$^3$.

7. An apparatus for detecting a diaphragm failure, comprising:

a substrate having a portion removed to form the diaphragm;

a line-shaped resistor formed of one type of material and disposed on at least one side of the diaphragm where one end of the line-shaped resistor is coupled to a failure detection terminal for sensing a resistance of the one type of material.

8. An apparatus according to claim 7, wherein the multiple line elements are distributed symmetrically on the first major surface.

9. An apparatus according to claim 7, wherein the portion of the first major surface overlying the diaphragm is substantially covered entirely by the plurality of line-shaped resistors.

10. An apparatus according to claim 7, wherein the diaphragm and the substrate are formed of silicon of a first conductivity type, and the line-shaped resistors are formed of a diffusion layer of a second conductivity type.

11. An apparatus according to claim 10, wherein a dopant concentration of the diffusion layer comprising the plurality of line-shaped resistors is 1E+19 to 1E+20 atoms/cm$^3$.

* * * * *